US008503697B2

(12) United States Patent
Amada

(10) Patent No.: US 8,503,697 B2
(45) Date of Patent: Aug. 6, 2013

(54) PICKUP SIGNAL PROCESSING APPARATUS, METHOD, AND PROGRAM PRODUCT

(75) Inventor: Tadashi Amada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 13/219,844

(22) Filed: Aug. 29, 2011

(65) Prior Publication Data

US 2011/0313763 A1 Dec. 22, 2011

Related U.S. Application Data

(63) Continuation of application No. PCT/JP2009/067709, filed on Oct. 13, 2009.

(30) Foreign Application Priority Data

Mar. 25, 2009 (JP) ................................ 2009-074900

(51) Int. Cl.
*H03G 3/00* (2006.01)
*H04R 3/00* (2006.01)

(52) U.S. Cl.
USPC ............................................ 381/104; 381/95

(58) Field of Classification Search
USPC .................................................... 381/95–108
See application file for complete search history.

(56) References Cited

U.S. PATENT DOCUMENTS

| | | | | |
|---|---|---|---|---|
| 5,291,558 | A * | 3/1994 | Ross | 381/107 |
| 5,708,722 | A * | 1/1998 | Forgues et al. | 381/94.1 |
| 5,983,183 | A * | 11/1999 | Tabet et al. | 704/270 |
| 7,349,547 | B1 * | 3/2008 | Isvan | 381/104 |
| 7,587,056 | B2 * | 9/2009 | Zhang | 381/94.1 |
| 7,706,550 | B2 * | 4/2010 | Amada et al. | 381/94.1 |
| 8,116,485 | B2 * | 2/2012 | Escott et al. | 381/107 |
| 2004/0057586 | A1 * | 3/2004 | Licht | 381/94.7 |
| 2005/0152563 | A1 | 7/2005 | Amada et al. | |
| 2005/0276423 | A1 * | 12/2005 | Aubauer et al. | 381/92 |
| 2006/0210096 | A1 * | 9/2006 | Stokes et al. | 381/107 |
| 2009/0238369 | A1 * | 9/2009 | Ramakrishnan et al. | 381/56 |

OTHER PUBLICATIONS

International Search Report for International Application No. PCT/JP2009/067709 mailed on Feb. 9, 2010.

* cited by examiner

*Primary Examiner* — Samuel G Neway
(74) *Attorney, Agent, or Firm* — Turocy & Watson, LLP

(57) ABSTRACT

According to one embodiment, a pickup signal processing apparatus includes microphones, a sound determining unit, a signal level calculating unit, a setting unit, and a calculating unit. The sound determining unit determines whether pickup signals picked up by the microphones are signals from a neighboring sound source or a background noise signal. The signal level calculating unit calculates the signal levels for the microphones. The setting unit sets a gain value of at least one microphone and reduces a difference between the signal levels for the microphones on the basis of the signal levels for the microphones, when determined that the pickup signal is the background noise signal. The calculating unit multiplies the pickup signal of the at least one microphone by the gain value set by the setting unit.

11 Claims, 10 Drawing Sheets

PICKUP SIGNAL PROCESSING APPARATUS, METHOD, AND PROGRAM PRODUCT

CROSS-REFERENCE TO RELATED APPLICATIONS

This application is a continuation of PCT international application Ser. No. PCT/JP2009/067709 filed on Oct. 13, 2009 which designates the United States, and which claims the benefit of priority from Japanese Patent Application No. 2009-074900, filed on Mar. 25, 2009; the entire contents of which are incorporated herein by reference.

FIELD

Embodiments described herein relate generally to a pickup signal processing apparatus, a pickup signal processing method, and a pickup signal processing program product that process pickup signals acquired by a plurality of microphones.

BACKGROUND

In recent years, many studies have been conducted on a technique for enhancing a signal coming from a specific direction using a plurality of microphones but suppressing the other sound signals, or a technique for detecting the direction of a sound source. There is a delay-and-sum array as a representative microphone array method (J. L. Flanagan, J. D. Johnston, R. Zahn and G. W. Elko, "Computer-steered microphone arrays for sound transduction in large rooms," J. Acoust. Soc. Am., vol. 78, No. 5, pp. 1508-1518, 1985). This method is based on a principle in which, when a predetermined delay is inserted into the signal of each microphone and an adding process is performed, only the signals coming from a predetermined direction are composed in the same phase and then enhanced, but the signals coming from the other directions have different phases and are composed to have a low level. In the delay-and-sum array, the adding process is performed on the basis of this principle to enhance the signal in a specific direction. That is, directivity is formed in the specific direction. An output signal Y(t) obtained by the delay-and-sum array is represented by the following Expression (1):

$$Y(t) = \sum_{n=1}^{N} X_n(t + n\tau) \quad (1)$$

In Expression (1), N is the number of microphones and Xn(t) is a pickup signal obtained by each microphone (n=1 to N). It is assumed that the microphones are arranged at regular intervals in the order of suffix n. In addition, $\tau$ is a delay time for making the phases of the pickup signals equal to each other in the arrival direction of a target sound.

As another example of the microphone array method, there is a Griffith-Jim type array (L. J. Griffiths and C. W. Jim, "An Alternative Approach to Linearly Constrained Adaptive Beamforming," IEEE Trans. Antennas&Propagation, Vol. AP-30, No. 1, January, 1982). The Griffith-Jim type array is a method of removing an interference sound using an adaptive filter. For example, in the Griffith-Jim type array using two microphones, it is assumed that a target sound comes from the front of the array and an interference sound comes from the side of the array. In this case, the target sound coming from the front of the array is picked up in the same phase by the left and right microphones. As a result, the target sound is enhanced by the adding unit on the same principle as that in the delay-and-sum array. The target sound is subtracted in the same phase by a subtracting and is removed. Since the phase of the interference sound is not aligned between the microphones, the interference sound is output without being enhanced by the adding unit and being removed by the subtracting unit. It is a key point that the output signal of the subtracting unit is composed of only a so-called noise component except for the target sound. In the Griffith-Jim type array, the adaptive filter is driven using the output signal as a reference signal to remove the noise component remaining in the output of the adding unit, thereby enhancing the target sound.

In the above-mentioned array processing, it is premised that a plurality of microphones has the same sensitivity. However, in practice, the sensitivities of the microphones are different from each other and a variation in the sensitivity over time is not negligible. Therefore, it is difficult to constantly maintain the same sensitivity. When the microphones having different sensitivities are used to form an array, it is difficult to form designed directivity. For example, in the Griffith-Jim type array, the subtracting unit is used to remove the target sound. However, when two microphones have different sensitivities, a difference in amplitude remains even when the target sounds are subtracted in the same phase. The remaining difference is supplied to the adaptive filter. When the adaptive filter is used, some of the target sound components are removed from the output of the adding unit and a significant problem which causes distortion in the final output signal occurs.

DETAILED DESCRIPTION

In general, according to one embodiment, a pickup signal processing apparatus includes microphones, a sound determining unit, a signal level calculating unit, a setting unit, and a calculating unit. The sound determining unit determines whether pickup signals picked up by the microphones are signals from a neighboring sound source or a background noise signal. The signal level calculating unit calculates the signal levels for the microphones. The setting unit sets a gain value of at least one microphone and reduces a difference between the signal levels for the microphones on the basis of the signal levels for the microphones, when determined that the pickup signal is the background noise signal. The calculating unit multiplies the pickup signal of the at least one microphone by the gain value set by the setting unit.

Hereinafter, a pickup signal processing apparatus, a method, and a program according to exemplary embodiments will be described in detail with reference to the accompanying drawings.

Figure 1:
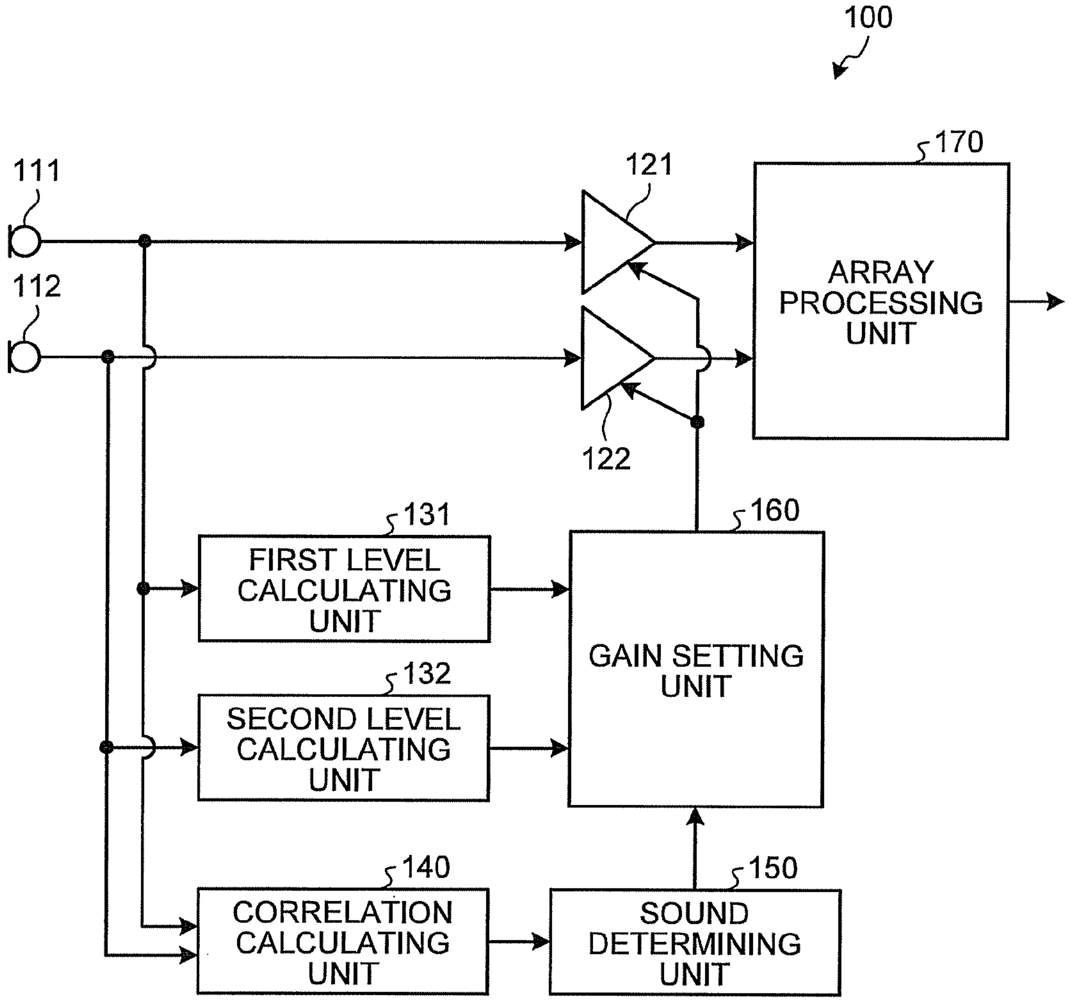
FIG. 1 is a block diagram illustrating the structure of a pickup signal processing apparatus.

FIG. 1 is a block diagram illustrating the structure of a pickup signal processing apparatus 100 according to a first embodiment. The pickup signal processing apparatus 100 according to this embodiment performs pickup signal processing in a microphone array including two microphones. The number of microphones forming the microphone array is not limited to two. The microphone array may include three or more microphones.

The pickup signal processing apparatus 100 includes a first microphone 111, a second microphone 112, a first gain calculating unit 121, a second gain calculating unit 122, a first level calculating unit 131, a second level calculating unit 132, a correlation calculating unit 140, a sound determining unit 150, a gain setting unit 160, and an array processing unit 170.

The first microphone 111 and the second microphone 112 form the microphone array and each acquire pickup signals. The pickup signal acquired by the first microphone 111 is input to the first gain calculating unit 121, the first level calculating unit 131, and the correlation calculating unit 140. The pickup signal acquired by the second microphone 112 is input to the second gain calculating unit 122, the second level calculating unit 132, and the correlation calculating unit 140.

The first gain calculating unit 121 multiplies the pickup signal acquired by the first microphone 111 by a gain value. The second gain calculating unit 122 multiplies the pickup signal acquired by the first microphone 111 by a gain value. In this way, it is possible to correct a difference in sensitivity between plural microphones forming the microphone array. The gain values used by the first gain calculating unit 121 and the second gain calculating unit 122 are set by the gain setting unit 160.

The first level calculating unit 131 calculates the signal level of the received signal acquired by the first microphone 111. The second level calculating unit 132 calculates the signal level of the received signal acquired by the second microphone 112. Specifically, each of the first level calculating unit 131 and the second level calculating unit 132 calculates the average value Ln of signal power as the signal level using the following Expression (2)

$$L_n=E\{X_n(t)^2\}(n=1,2) \quad (2)$$

In Expression (2), E{ } indicates an expectation value and is calculated by a time average. X indicates a pickup signal, t indicates a time index, and n indicates identification information for identifying a microphone, that is, a channel number. Each of the first level calculating unit 131 and the second level calculating unit 132 periodically calculates the signal level with a predetermined level calculation time period.

As another example, a recursive average Ln(t) may be calculated as the signal level by the following Expression (3)

$$L_n(t)=(1-\alpha)L_n(t-1)+\alpha X_n(t)^2 \quad (3)$$

In Expression (3), α is a positive value less than 1.

As another example, the average value of the signal power may be combined with the recursive average to apply the recursive average to the average power of a time window. In addition, an amplitude may be used instead of the square of the pickup signal. A maximum value may be used instead of the average value. As described above, the signal level of the pickup signal may be calculated by the existing technique, and a method of the calculating the signal level is not limited to this embodiment.

The correlation calculating unit 140 periodically acquires the pickup signals from the first microphone 111 and the second microphone 112 with a predetermined correlation calculation time period and calculates the correlation therebetween. When the pickup signals acquired from the first microphone 111 and the second microphone 112 are X1(*t*) and X2(*t*), a cross-correlation R12 between X1(*t*) and X2(*t*) is defined by the following Expression (4):

$$R_{12}(\tau)=E\{X_1(t)*X_2(t+\tau)\} \quad (4)$$

The correlation calculating unit 140 calculates the correlation between X1(*t*) and X2(*t*) using a normalized correlation function r12 that normalizes the correlation at a window width T with the power of the signal. Suffixes 1 and 2 of r indicate channel numbers. Specifically, the correlation calculating unit 140 calculates the correlation r12 between X1(*t*) and X2(*t*) at a time t0 using the following Expression (5):

$$r_{12}(t_0,\tau)=\phi_{12}(t_0,\tau)/sqrt(P_{11}(t_0)*P_{22}(t_0+\tau\mathbf{0})) \quad (5)$$

Herein, ϕ12 is calculated by the following Expression (6) and Pii is calculated by the following Expression (7).

$$\phi_{12}(t_0,\tau)=\sum_{t=t_0-T/2}^{t_0+T/2} X_1(t)*X_2(t+\tau) \quad (6)$$

$$P_{ii}(t_0)=\sum_{t=t_0-T/2}^{t_0+T/2} X_i(t)^2 \quad (7)$$

The suffixes 1 and 2 of ϕ and the suffix i of P each indicate a channel number. In the normalized correlation function, the value is normalized to 0 to 1. Therefore, it is convenient to use the correlation as an index indicating the strength of the correlation. When the number of microphones is three or more, that is, the number of channels is three or more, the correlation can be calculated by the integration of the correlation values of two microphones, that is, two channels.

When a combination of all of three or more channels is used, the correlation calculating unit 140 calculates a correlation rm(t0, τ) using the following Expression (8):

$$rm(t_0,\tau)=\sum_{i<j}\phi_{ij}(t_0,\tau)\Big/\sum_{i<j}\mathrm{sqrt}(P_{ii}(t_0)*P_{jj}(t_0+\tau)) \quad (8)$$

As another example, instead of the integration (i<j) of all channels, another integration method, such as the integration (j=i+1) of adjacent channels, may be used. Next, for simplicity, a case in which a normalized correlation function r12(t0, τ) of two channels is used will be described, which is the same as that in a case in which three or more channels are used.

The correlation calculating unit 140 calculates a plurality of correlation values for different values of τ and specifies the maximum value r12_max(t0, τ_max) of the correlation value related to τ. A large correlation value means that a signal with a large correlation arrives. In this case, τ_max indicates a time difference until the signals reach the two microphones, that is, a sound source direction. The correlation calculating unit 140 sets an observation time t0 with a calculation regulation time period, specifies the maximum value r12_max of the correlation value calculated at each time t0, and outputs the maximum value to the sound determining unit 150 each time the specification is performed.

It is preferable that a level calculation time period, which is the signal level calculation timing of the first level calculating unit 131 and the second level calculating unit 132, be equal to a correlation calculation time period, which is the correlation calculation timing of the correlation calculating unit 140. However, the calculation timings of the signal level and the correlation may be close to each other, and they are not necessarily equal to each other.

In general, as the distance of the microphone array from the sound source increases, the correlation between the channels is reduced. Therefore, it is possible to detect the existence of a neighboring sound source on the basis of the correlation between the channels. When a temporally discontinuous signal, such as a voice signal, is handled, there are a voice signal section in which a voice signal is present and a section in which the voice signal is absent, that is, a background noise section. The voice signal means a signal including a voice emitted from a neighboring sound source. That is, the neighboring sound source means a sound source that emits a sound which can be recognized as a voice by the microphone array. The background noise signal means a noise signal that is picked up by the microphone array when no voice signal is emitted from the neighboring sound source. For example, in a microphone array that is set in order to pick up the voice of a driver in a vehicle, the signal of the voice of the person on the seat next to the driver is also a signal from a neighboring sound source with respect to the microphone array and is a voice signal. For example, a signal from the siren of an ambulance that travels in the distance is not a signal from the neighboring sound source, but is a background noise signal.

When the pickup signal is a voice signal from a neighboring sound source adjacent to the microphone array, the correlation between the channels is large. When the pickup signal is a background noise signal including only background noise, the correlation between the channels is small. In this embodiment, the maximum value r12_max of the correlation is calculated and it is determined whether the pickup signal is a voice signal or a background noise signal on the basis of the maximum value r12_max of the correlation.

The sound determining unit 150 acquires the maximum value r12_max of the correlation from the correlation calculating unit 140. Then, the sound determining unit 150 compares the acquired maximum value r12_max with a predetermined threshold value r12_th of the correlation value. When the maximum value r12_max is less than the threshold value r12_th, the sound determining unit 150 determines that the correlation is small and the pickup signal is a background noise signal. On the other hand, when the maximum value r12_max is equal to or more than the threshold value r12_th, the sound determining unit 150 determines that the correlation is large and the pickup signal is a voice signal. The threshold value r12_th is calculated by experiments. In the experiments, a pickup signal with respect to background noise and a voice is measured and the threshold value is calculated from the measurement result. In order to exactly determine whether the pickup signal is a background noise signal or a voice signal, it is preferable that the measurement be performed in an environment closest to the environment in which the pickup signal processing apparatus 100 is installed.

The gain setting unit 160 acquires the determination result indicating whether the pickup signal is a voice signal or a background noise signal from the sound determining unit 150 with a predetermined gain setting time period. The gain setting unit 160 acquires the signal levels of the pickup signals of the first microphone 111 and the second microphone 112 from the first level calculating unit 131 and the second level calculating unit 132. When the pickup signal is a background noise signal, the gain setting unit 160 determines a gain value to be multiplied by each pickup signal on the basis of the signal levels of the pickup signals acquired by the first microphone 111 and the second microphone 112. The gain setting unit 160 sets the gain value that is determined with respect to the pickup signal acquired by the first microphone 111 to the first gain calculating unit 121 and sets the gain value that is determined with respect to the pickup signal acquired by the second microphone 112 to the second gain calculating unit 122.

For example, when the average power of the pickup signal satisfies L1<L2, the gain setting unit 160 reduces the gain of channel 2 that is set to the second gain calculating unit 122 and increases the gain of channel 1 that is set to the first gain calculating unit 121. In this way, it is possible to update the gain value in a direction in which the difference in sensitivity between the two microphones is reduced. Specifically, the gain setting unit 160 sets the gains represented by the following Expression (9) and Expression (10) to the gain calculating unit of each channel:

$$G_{1\_new}=G_{1\_old}*sqrt(L_x/L_1) \quad (9)$$

$$G_{2\_new}=G_{2\_old}*sqrt(L_x/L_2) \quad (10)$$

The gain value that is currently being set to the channel n is Gn_old and the gain value that is newly set to the gain calculating unit of channel n by the gain setting unit 160 is Gn_new. In addition, Lx is a target value of average power and is represented by the following Expression (11):

$$L_x=(L_1+L_2)/2 \quad (11)$$

The gain setting unit 160 sets new gain values G1_new and G2_new that are calculated on the basis of the signal levels of the pickup signals acquired from the first level calculating unit 131 and the second level calculating unit 132 to the first gain calculating unit 121 and the second gain calculating unit 122, respectively. In this way, it is possible to adjust the signal level such that the difference between the sensitivities of the pickup signals, that is, the difference between the signal levels of the pickup signals acquired by the first microphone 111 and the second microphone 112 is reduced, and preferably, the signal levels of the pickup signals are made equal to each other.

Figure 2:
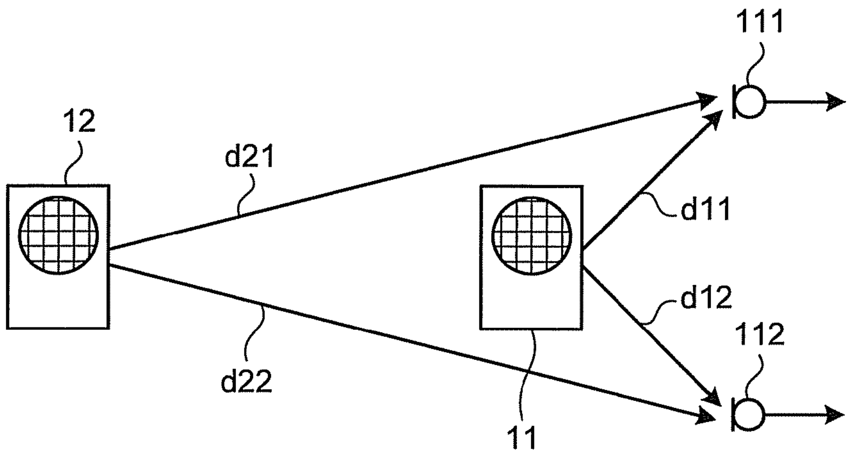
FIG. 2 is a diagram illustrating an example of the arrangement of microphones and sound sources.

A method of independently controlling the gain of each microphone such that a target level (for example, the level of a reference microphone) is obtained is considered in order to adjust the gain of the pickup signal, thereby correcting the sensitivity. However, this method has problems. In an example of the arrangement shown in FIG. 2, sound sources 11 and 12 are disposed in front of the microphone arrays 111 and 112, that is, at positions that are equidistant from the microphones 111 and 112. In this case, the ratio (d11/d12 and d21/d22) of the distances between the sound sources 11 and 12 and the two microphones 111 and 112 is 1 regardless of the distances between the sound sources 11 and 12 and the microphones 111 and 112.

Figure 3:
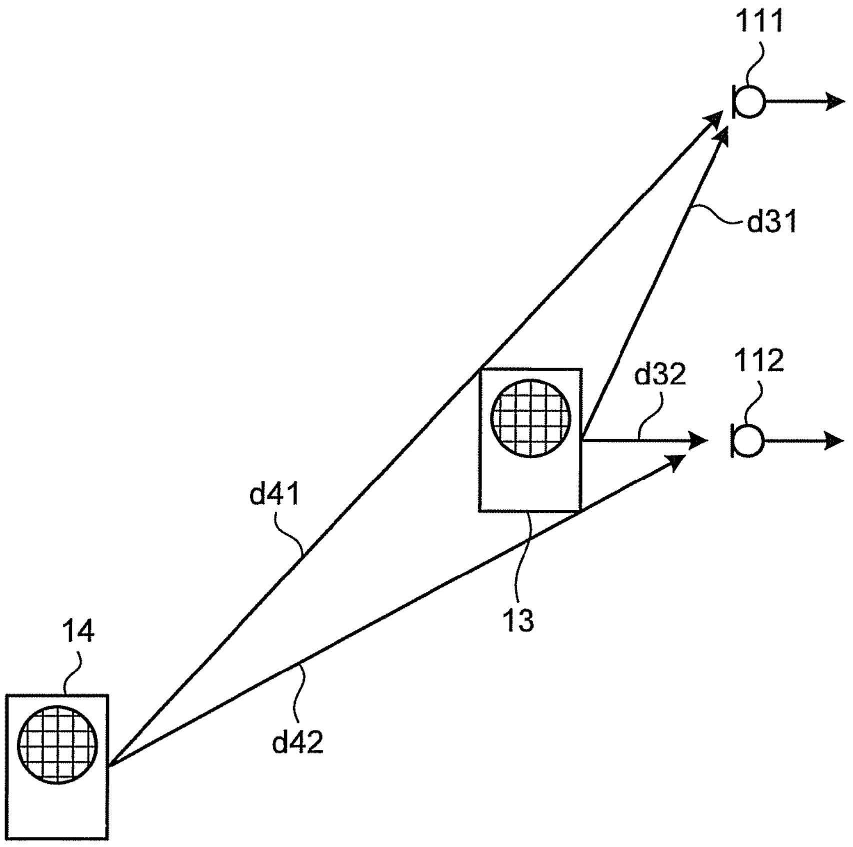
FIG. 3 is a diagram illustrating an example of the arrangement of the microphones and the sound sources.

In an example shown in FIG. 3, sound sources 13 and 14 are arranged so as to be inclined with respect to the microphone arrays 111 and 112. In this case, the ratio (d31/d32 and d41/d42) of the distances to the two microphones 111 and 112 varies depending on a sound source distance. That is, as the distances between the microphones 111 and 112 and the sound sources 13 and 14 increase, the ratio of the distances from the sound sources 13 and 14 to the microphones 111 and 112 is closer to 1. On the other hand, as the distances between the microphones 111 and 112 and the sound sources 13 and 14 are reduced, the ratio of the distances from the sound sources 13 and 14 to the microphones 111 and 112 is larger than 1.

In general, the energy of the sound wave picked up by the microphone is inversely proportional to the square of the distance from the sound source. Therefore, as the ratio of the distances increases, the ratio of the power levels of the pickup signals increases. That is, when the sound source is arranged close to the microphone array so as to be inclined with respect to the microphone array and a plurality of microphones has the same sensitivity, the microphones will acquire pickup signals with different signal power levels, that is, different signal levels. When the gain is adjusted such that the signal levels that should be different from each other for the microphones are equal to each other, the pickup signals are adjusted to be different from those obtained when the microphones having the same sensitivity are used.

For example, the microphone array is provided in a room mirror in order to pick up the voice of the driver in the vehicle. In this case, the driver, who is a main sound source, is obliquely disposed with respect to the microphone array. When the gain is simply adjusted such that the signal power levels of the microphones are equal to each other, the phenomenon in which, when the driver makes a sound, the microphone closer to the driver outputs a signal with a higher level does not occur. In addition, whenever another sound source, such as a fellow passenger, appears in another direction in use, the gain is adjusted such that the sound source direction is opposite. However, this is not obtained by adjusting the sensitivities of the microphones and it is difficult to appropriately adjust the gain.

Only when there is no neighboring sound source, that is, when the pickup signal is a background noise signal, the gain setting unit 160 calculates a new gain value and sets the new gain value to the first gain calculating unit 121 and the second gain calculating unit 122. In this way, it is possible to prevent the gain from being inappropriately adjusted such that the signal power levels that should be different from each other are made equal to each other.

The array processing unit 170 performs array processing using the pickup signals which are adjusted in the first gain calculating unit 121 and the second gain calculating unit 122 on the basis of the gain value set by the gain setting unit 160. As the array processing, a process using a Griffith-Jim type array is performed. As another example, the array processing unit 170 may perform signal processing using a plurality of microphones, such as a delay-and-sum array or an ICA. Since the array processing unit 170 performs a process using the pickup signals whose signal levels are adjusted by the first gain calculating unit 121 and the second gain calculating unit 122, it is possible to form designed directivity.

Figure 4:
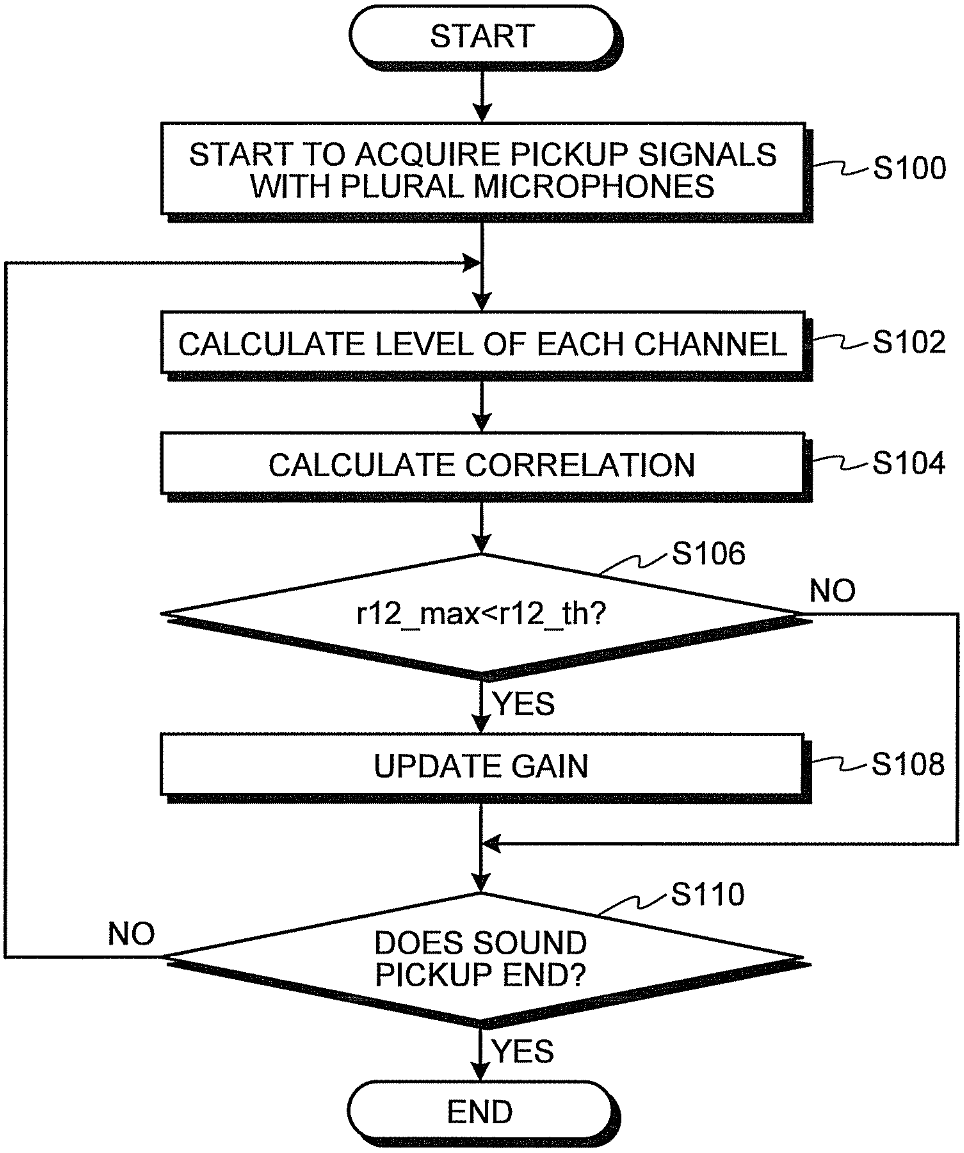
FIG. 4 is a flowchart illustrating a pickup signal processing operation of the pickup signal processing apparatus.

FIG. 4 is a flowchart illustrating the pickup signal processing operation of the pickup signal processing apparatus 100. First, the first microphone 111 and the second microphone 112 forming the microphone array acquire pickup signals (Step S100). Then, the first level calculating unit 131 and the second level calculating unit 132 calculate the signal levels of the pickup signals acquired by the first microphone 111 and the second microphone 112 whenever a level calculation time has elapsed (Step S102). The correlation calculating unit 140 calculates a correlation value between the pickup signal acquired by the first microphone 111 and the pickup signal acquired by the second microphone 112 whenever a correlation calculation time has elapsed and outputs the maximum value r12_max of the correlation to the sound determining unit 150 (Step S104).

The sound determining unit 150 compares the maximum value r12_max acquired from the correlation calculating unit 140 with a predetermined threshold value r12_th. When the maximum value r12_max is less than the threshold value r12_th (Step S106: Yes), the sound determining unit 150 determines that the pickup signal is a background noise signal. On the other hand, when the maximum value r12_max is equal to or more than the threshold value r12_th (Step S106: No), the sound determining unit 150 determines that the pickup signal is a voice signal.

The gain setting unit 160 acquires the determination result from the sound determining unit 150 whenever a gain setting time has elapsed. When the maximum value r12_max of the calculated correlation is more than the threshold value r12_th (Step S106: Yes), the gain setting unit 160 acquires the determination result indicating that the pickup signal is a background noise signal. In this case, the gain setting unit 160 updates the gain values set to the first gain calculating unit 121 and the second gain calculating unit 122 (Step S108).

Specifically, the gain setting unit 160 calculates new gain values G1_new and G2_new to be respectively set to the first gain calculating unit 121 and the second gain calculating unit 122 on the basis of the signal levels of the pickup signals acquired by the first level calculating unit 131 and the second level calculating unit 132. Then, the gain setting unit 160 sets the calculated new gain values to the first gain calculating unit 121 and the second gain calculating unit 122.

In Step S106, when the maximum value r12_max is equal to or more than the threshold value r12_th, that is, when the pickup signal is a voice signal (Step S106: No), the gain setting unit 160 does not update the gain. When the acquisition of the pickup signals by the first microphone 111 and the second microphone 112 does not end (Step S110: No), the process returns to Step S102 and the update process is continuously performed. When the acquisition of the pickup signals by the first microphone 111 and the second microphone 112 ends (Step S110: Yes), the process ends.

As described above, in the pickup signal processing apparatus 100 according to the first embodiment, the gain value is updated only in the background noise section. Therefore, the gain is adjusted using the voice signal in an environment in which adjacent sound sources are obliquely arranged and thus it is possible to exactly match the sensitivities of the microphones without performing an inappropriate gain adjustment operation of adjusting the signal power levels that should be different from each other so as to be equal to each other.

In the pickup signal processing apparatus 100, when the pickup signal is a background noise signal, the gain setting unit 160 updates the gain, if necessary, whenever a predetermined gain setting time has elapsed. Therefore, it is possible to automatically adjust the gain while the microphone array is being operated. Therefore, it is possible to perform gain adjustment responding to a variation in the microphone over time.

As a first modification of the embodiment, the sound determining unit 150 may compare each of the maximum values of a plurality of correlation values obtained at a plurality of times t0 within a predetermined time interval with the threshold value and determine that the pickup signal is a background noise when the maximum value of the correlation value is continuously equal to or less than the threshold value for a predetermined continuous time. In this way, it is possible to reduce the influence of a temporal variation in the correlation value.

As a second modification, the gain setting unit 160 may set the amount of adjustment of the gain values G1_old and G2_old set to the first gain calculating unit 121 and the second gain calculating unit 122 to a relatively small value and gradually update the gain value to a target gain value, which is the calculated new gain value. In this way, it is possible to prevent an auditory sense of incongruity due to the rapid adjustment of sensitivity.

In this case, new gain values that are set to the first gain calculating unit 121 and the second gain calculating unit 122 with a setting time period by the gain setting unit 160 are represented by the following Expressions (12) and (13)

$$G_{1\_new}=G_{1\_old}*G_{\_up} \quad (12)$$

$$G_{2\_new}=G_{2\_old}*G_{\_down} \quad (13)$$

In the above-mentioned expressions, G_up and G_down satisfy G_up>1 and G_down<1, respectively. For example, when a variation in the gain value during one update operation is about 1 dBup and 1 dBdown, the variation due to update is not perceived. Thus, it is possible to slowly adjust the gain by limiting an adjustment width (step size) changed by one adjustment operation.

In addition, the adjustment width may be set so as to increase as the difference in the signal level between the channels increase, and the gain value may be updated by the adjustment width. In this way, it is possible to reduce a convergence time until the new gain values G1_new and G2_new are set. As another example, as the difference in the signal level between the channels increases, the time interval at which the gain value is updated, that is, a setting time period may be reduced. In both cases, even while the gain value is being slowly changed, the target gain value is calculated and the target gain value is periodically updated.

In the first embodiment, when the pickup signal is a voice signal, the gain is not updated. However, as a third modification, during update, the step size may be reduced such that the degree of the update of the gain is reduced. In this way, it is possible to slowly adjust the gain.

Next, a fourth modification will be described. As described with reference to FIG. 2 and FIG. 3, when there is a sound source in front of the microphone array, the distances between the sound source and the microphones are equal to each other, regardless of the distance between the sound source and the microphone array. Therefore, even when the pickup signal is a voice signal, the gain may be updated when the sound source is disposed in front of the microphone array.

For example, the sound determining unit 150 compares the absolute value |τ_max| of a time difference that gives the maximum correlation value with a predetermined threshold value τ_th. When the relationship |τ_max|<τ_th is established, that is, when the sound source is disposed substantially in front of the microphone array, the gain setting unit 160 updates the gain. The threshold value τ_th is calculated by measuring τ which is obtained when the sound source is disposed substantially in front of the microphone array.

Figure 5:
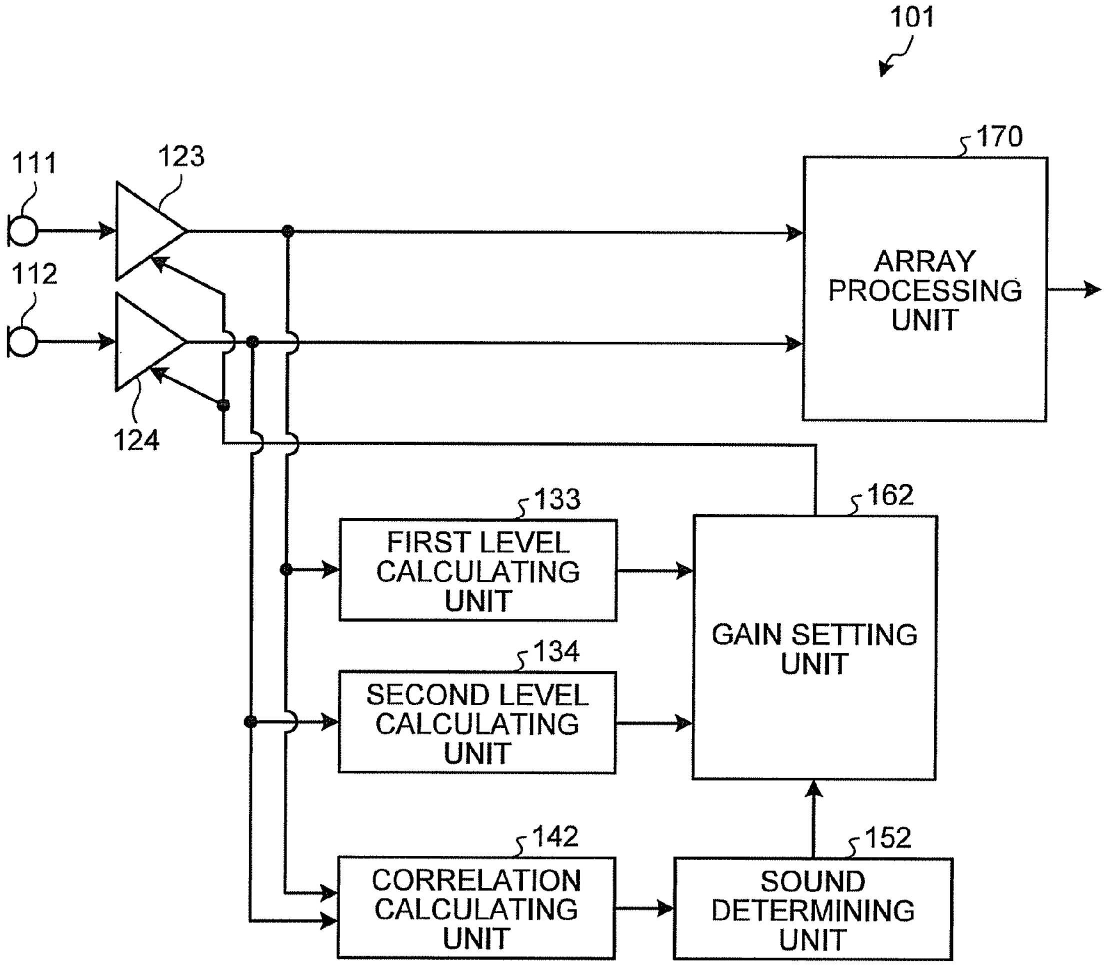
FIG. 5 is a block diagram illustrating the structure of a pickup signal processing apparatus according to a fifth modification.

FIG. 5 is a block diagram illustrating the structure of a pickup signal processing apparatus 101 according to a fifth modification. In the pickup signal processing apparatus 101 according to the fifth modification, a first level calculating unit 133 and a second level calculating unit 134 acquire the pickup signals whose gain values have been calculated by a first gain calculating unit 123 and a second gain calculating unit 124, respectively. Then, the first level calculating unit 133 and the second level calculating unit 134 calculate the signal levels of the pickup signals. A correlation calculating unit 142 acquires the pickup signals from the first gain calculating unit 123 and the second gain calculating unit 124, calculates a correlation value on the basis of the pickup signals, and outputs the correlation value to a sound determining unit 152. Since the signal levels of the gain-adjusted pickup signals are used, it is possible to simply perform a relative update operation of a gain setting unit 162 using Expression (9) and Expression (10).

As another example, the pickup signal before gain adjustment may be used to calculate the signal level and the pickup signal after gain adjustment may be used to calculate the correlation. On the contrary, the pickup signal after gain adjustment may be used to calculate the signal level and the pickup signal before gain adjustment may be used to calculate the correlation. It goes without saying that each of the above-mentioned modifications can be similarly applied to other embodiments.

Figure 6:
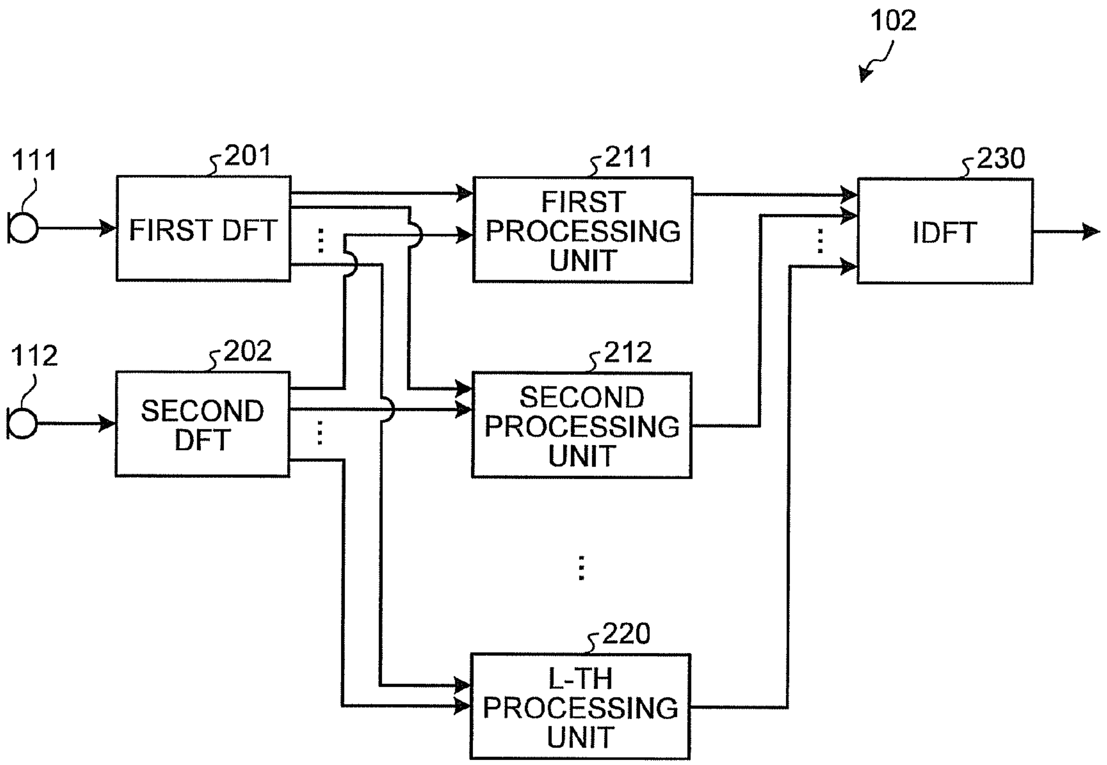
FIG. 6 is a block diagram illustrating the structure of a pickup signal processing apparatus.

FIG. 6 is a block diagram illustrating the structure of a pickup signal processing apparatus 102 according to a second embodiment. The pickup signal processing apparatus 102 according to the second embodiment converts a pickup signal, which is a time signal, into a signal in a frequency region. Then, the pickup signal processing apparatus 102 performs gain adjustment on each frequency component.

The pickup signal processing apparatus 102 includes a first microphone 111, a second microphone 112, a first DFT 201, a second DFT 202, first to L-th processing units 211 to 220, and an IDFT 230. The first DFT 201 converts the pickup signal acquired by the first microphone 111 into a signal in the frequency region. The second DFT 202 converts the pickup signal acquired by the second microphone 112 into a signal in the frequency region. The first DFT 201 and the second DFT 202 perform, specifically, discrete Fourier transform (DFT) as the process of converting the pickup signal into the signal in the frequency region. In DFT, a time window with a predetermined time width is set. Then, a continuous time signal is processed while the time window is shifted. Hereinafter, the unit of the signal cut out by the time window is referred to as a frame. L frequency components are obtained for each frame. The frequency components are input to the first to L-th processing units 211 to 220.

The first to L-th processing units 211 to 220 process the frequency components and output the processed signals. The first to L-th processing units 211 to 220 have the same structure and the first to L-th frequency components of the pickup signals acquired by the first microphone 111 and the second microphone 112 are input to the first to L-th processing units 211 to 220, respectively. The first to L-th processing units 211 to 220 perform a gain adjustment process on the acquired frequency signals. The IDFT 230 converts the frequency components acquired from each processing unit into time signals and outputs the time signals. Specifically, the IDFT 230 performs inverse discrete Fourier transform (IDFT).

Figure 7:
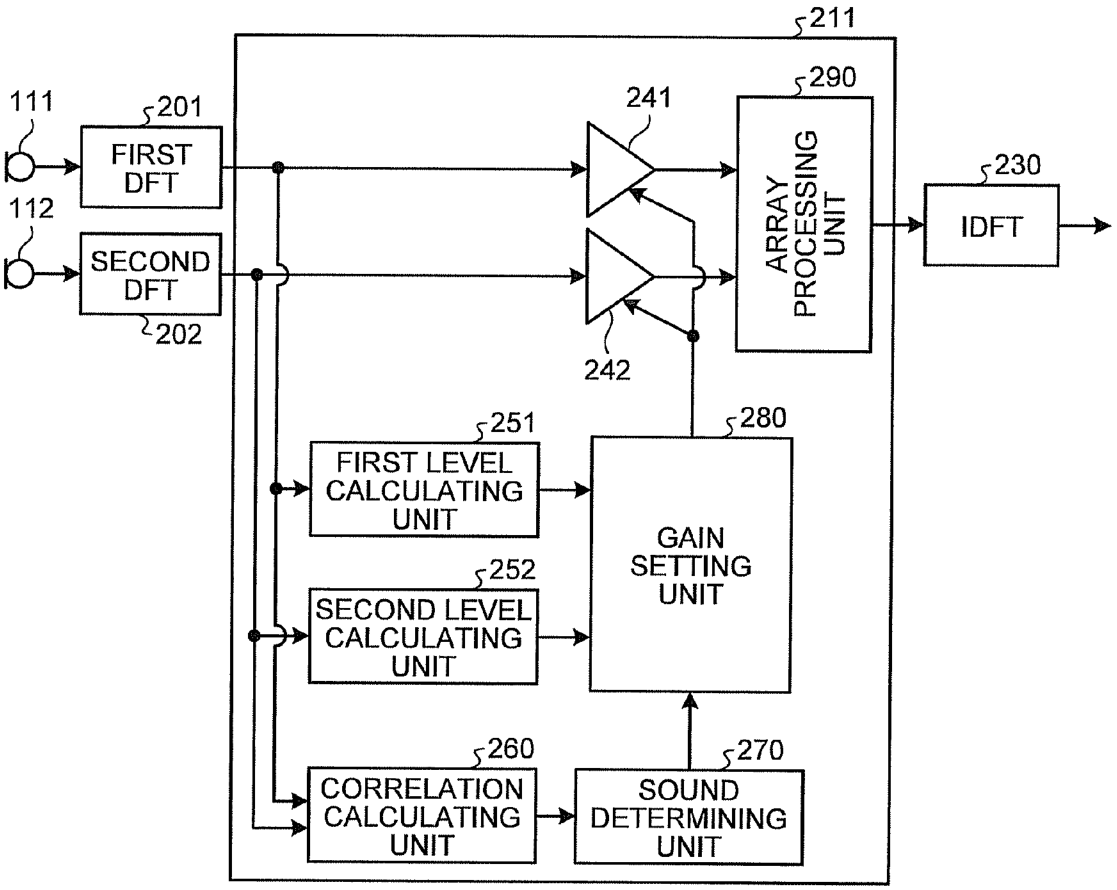
FIG. 7 is a block diagram illustrating the structure of a first processing unit.

FIG. 7 is a block diagram illustrating the structure of the first processing unit 211. The first frequency component of the pickup signal acquired by the first microphone 111 is input from the first DFT 201 to the first processing unit 211. The first frequency component of the pickup signal acquired by the second microphone 112 is input from the second DFT 202 to the first processing unit 211. The first processing unit 211 performs a gain adjustment process on these frequency signals.

The first processing unit 211 includes a first gain calculating unit 241, a second gain calculating unit 242, a first level calculating unit 251, a second level calculating unit 252, a correlation calculating unit 260, a sound determining unit 270, a gain setting unit 280, and an array processing unit 290.

The first gain calculating unit 241 and the second gain calculating unit 242 acquire the first frequency components from the first DFT 201 and the second DFT 202, respectively. Then, the first gain calculating unit 241 and the second gain calculating unit 242 multiply each of the first frequency components by gain values. The gain values used by the first gain calculating unit 241 and the second gain calculating unit 242 are set by the gain setting unit 280.

The first level calculating unit 251 and the second level calculating unit 252 acquire the first frequency components from the first DFT 201 and the second DFT 202, respectively. Then, the first level calculating unit 251 and the second level calculating unit 252 calculate the signal levels of the frequency components. Specifically, each of the first level calculating unit 251 and the second level calculating unit 252 calculates the average value Ln(l) of the signal power of the L-th frequency component using the following Expression (14):

$$\mathrm{Ln}(l)=E\{|X_n(l)|^2\}(l=1, 2, \ldots , L) \tag{14}$$

(where l is a frequency component number).

In addition, an expectation value is calculated as a frame average. Since Xn(l) is a complex number, the square of the absolute value of Xn(l) is used to calculate signal power.

The correlation calculating unit 260 acquires the first frequency components from the first DFT 201 and the second DFT 202 and calculates the correlation therebetween. The correlation calculating unit 260 calculates the correlation using coherence, which is a representative index indicating the correlation of each frequency component. Specifically, the correlation calculating unit 260 calculates the coherence between channels 1 and 2 of the L-th frequency component as the correlation using the following Expression (15):

$$\gamma_{12}(l)=E\{conj(X_1(l))*(X_2(l))\}/sqrt(E\{|X_1(l)|^2\}*E\{|X_2(l)|^2\}) \tag{15}$$

(where conj( ) indicates a conjugate complex number and sqrt( ) indicates a square root).

The coherence is a complex number and the absolute value of the coherence is in the range of 0 to 1. As the absolute value is closer to 1, the correlation is higher.

The sound determining unit 270 compares the correlation value calculated by the correlation calculating unit 260 with a predetermined threshold value r12_th. When the correlation value r12 calculated by the correlation calculating unit 260 is less than the threshold value r12_th, the sound determining unit 270 determines that the correlation is small and the pickup signal is a background noise signal. When the correlation value r12 is equal to or more than the threshold value r12_th, the sound determining unit 270 determines that the correlation is large and the pickup signal is a voice signal. The threshold value r12_th is calculated by experiments. A large absolute value of the coherence shows that there is a neighboring sound source. Therefore, it is possible to determine whether the pickup signal is a background noise signal or a voice signal on the basis of the absolute value of the coherence.

The gain setting unit 280 acquires the determination result indicating whether the pickup signal is a voice signal or a background noise signal from the sound determining unit 270. The gain setting unit 280 calculates the signal levels of the L-th frequency components of the pickup signals of the first microphone 111 and the second microphone 112 acquired by the first level calculating unit 251 and the second level calculating unit 252. When the pickup signal is a background noise signal, the gain setting unit 280 determines gain values to be multiplied by the L-th frequency components corresponding to each microphone on the basis of the signal levels of the L-th frequency components of the pickup signals acquired by the first microphone 111 and the second microphone 112 and sets the gain values to the first gain calculating unit 241 and the second gain calculating unit 242.

The array processing unit 290 acquires the gain-adjusted L-th frequency components from the first gain calculating unit 241 and the second gain calculating unit 242, performs array processing on the L-th frequency components, and outputs the processed L-th frequency components to the IDFT 230.

In the pickup signal processing apparatus 102 according to this embodiment, it is possible to adjust the gain of each of the L frequency components. In this way, when the difference between the sensitivities of the microphones is different in each frequency region, it is possible to adjust the gain value to a value suitable for each frequency component.

The process and structure of the pickup signal processing apparatus 102 according to the second embodiment other than the above are the same as those of the pickup signal processing apparatus 100 according to the first embodiment.

As a first modification of the pickup signal processing apparatus 102 according to the second embodiment, it may be determined whether the voice signal is a background noise signal or a voice signal on the basis of the correlation value that is calculated for a predetermined frequency component and the determination result may be used for other frequency components. For example, when there is a large amount of noise in a specific frequency, it is difficult to determine whether the voice signal is a noise signal on the basis of the correlation value calculated for the frequency. For example, when there is a neighboring sound source of a wideband signal, such as a voice, it is possible to use a correlation value calculated by a predetermined frequency component in order to detect the existence of the neighboring sound source.

In addition, a low frequency component has a high correlation, regardless of whether there is a neighboring sound source. Therefore, the accuracy of determining whether the pickup signal is a voice signal or a noise signal is likely to be reduced. A processing unit corresponding to a relatively low frequency component may not perform a process using the correlation calculating unit and the sound determining unit, and may use the determination result obtained from a processing unit corresponding to a relatively high frequency component. In this way, it is possible to improve the accuracy of determining whether the pickup signal is a voice signal or a noise signal.

As a second modification, the pickup signal processing apparatus 102 may not include the IDFT 230. For example, when only spectrum information is needed in order to recognize a voice, the pickup signal processing apparatus 102 may output the frequency component without performing IDFT.

Figure 8:
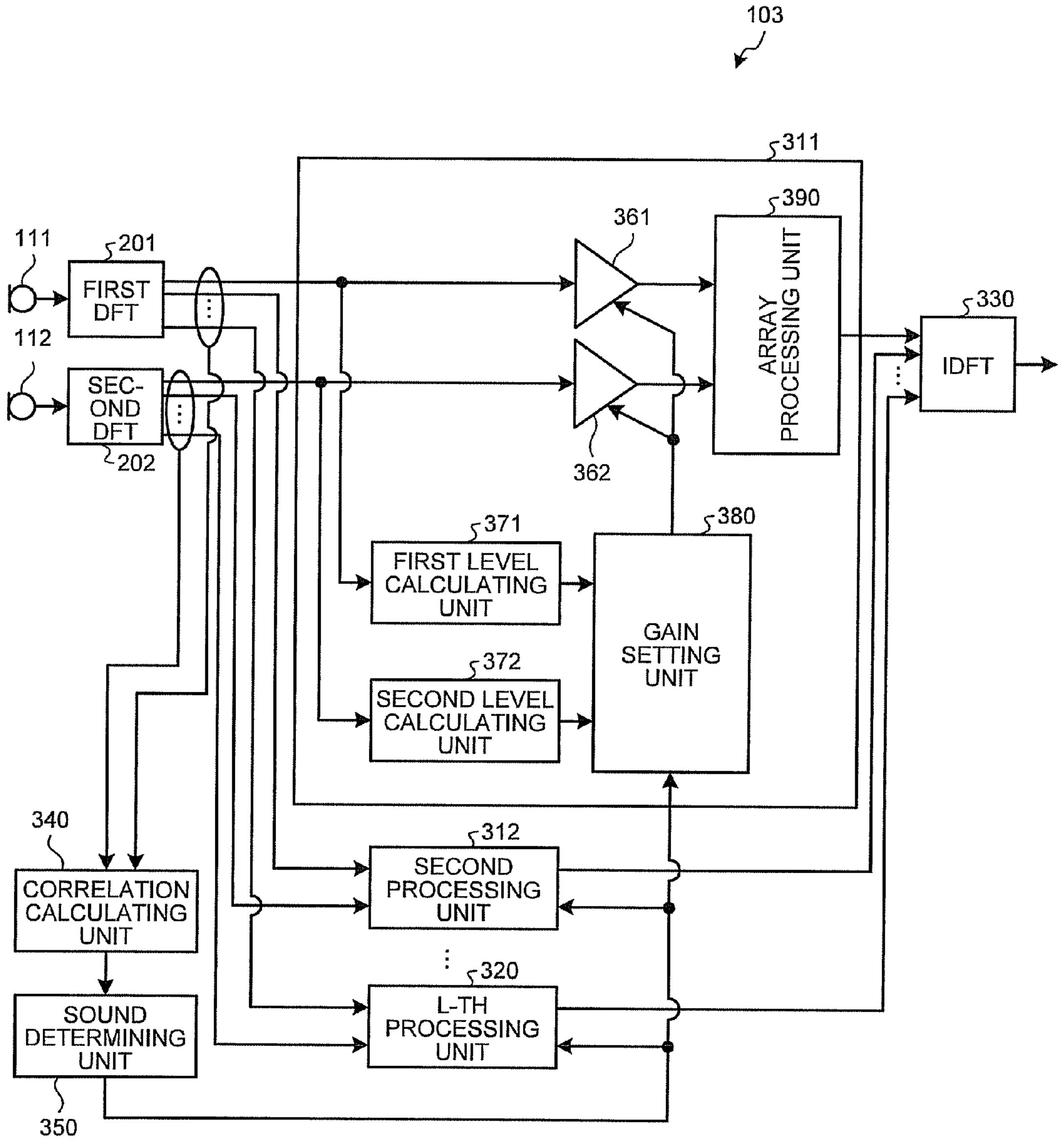
FIG. 8 is a block diagram illustrating the structure of a pickup signal processing apparatus; according to a third embodiment.

FIG. 8 is a block diagram illustrating the structure of a pickup signal processing apparatus 103 according to a third embodiment. The pickup signal processing apparatus 103 according to the third embodiment includes a plurality of processing units, that is, first to L-th processing units 311 to 320 that adjust the gain of each frequency component, similarly to the pickup signal processing apparatus 102 according to the second embodiment. However, the pickup signal processing apparatus 103 does not include a plurality of correlation calculating units and a plurality of sound determining units corresponding to each frequency component, but includes one correlation calculating unit 340 and one sound determining unit 350.

The correlation calculating unit 340 acquires all of the frequency components obtained by the first DFT 201. In addition, the correlation calculating unit 340 acquires all of the frequency components obtained by the second DFT 202. The correlation calculating unit 340 calculates the correlation between the pickup signal acquired by the first microphone 111 and the pickup signal acquired by the second microphone 112 from all of the acquired frequency components. The correlation calculating unit 340 calculates a generalized cross-correlation function (GCC) as a correlation value from all of the frequency components using the following Expression (16):

$$GCC(\tau)=IDFT\{w(l)*G_{12}(l)\} \tag{16}$$

In the above-mentioned expression, G12($l$) is a cross-spectrum between X1($l$) and X2($l$) and w(l) is a weight for each frequency. The cross-spectrum may be an expectation value, which is E{conj(X1($l$)*X2($l$))}, or may be independently calculated for each frame, and the former can be obtained with high accuracy. w(l) is calculated by the following Expression (17):

$$w(l)=l/sqrt(G_{11}(l)*G_{22}(l) \tag{17}$$

The generalized cross-correlation function is characterized in that a cross-correlation function varies depending on a method of determining w(l), which is disclosed in detail in C. H. Knapp and G. C. Carter, "The Generalized Correlation Method for Estimation of Time Delay, "IEEE Trans, Acoust., Speech, Signal Processing, Vol. ASSP-24, No. 4, pp. 320-327, 1976.

GCC(τ) is a function having the same property as the cross-correlation function R12(τ) described in the first embodiment except that it is weighted to each frequency. Therefore, GCC(τ) can be handled similarly to R12(τ) according to the first embodiment. For example, the peak of GCC(τ) indicates the strength of the correlation, and the time for which the peak is given corresponds to the sound source direction.

There is a CSP (Cross Spectral Phase) as a correlation function similar to GCC. In addition, a weighted CSP in which a weight is given to CSP has been proposed. These correlation functions are considered as examples of GCC, and the correlation calculating unit 340 may calculate the correlation value using these functions.

The sound determining unit 350 acquires the correlation value GCC(τ) from the correlation calculating unit 340. Then, the sound determining unit 350 compares the acquired correlation value with a predetermined threshold value GCC(τ)_th. When the correlation value GCC(τ) calculated by the correlation calculating unit 340 is less than the threshold value GCC(τ)_th, the sound determining unit 350 determines that the pickup signal is a background noise signal. When the correlation value GCC(τ) calculated by the correlation calculating unit 340 is equal to or more than the threshold value GCC(τ)_th, the sound determining unit 350 determines that the pickup signal is a voice signal. The sound determining unit 350 outputs the determination result to the gain setting unit of each of the processing units 311 to 320.

The first processing unit 311 includes a first gain calculating unit 361, a second gain calculating unit 362, a first level calculating unit 371, a second level calculating unit 372, a gain setting unit 380, and an array processing unit 390. The first processing unit 311 does not include the correlation calculating unit and the sound determining unit. The gain setting unit 380 acquires the determination result indicating whether the pickup signal is a voice signal or a background noise signal from the sound determining unit 350. In addition, the gain setting unit 380 acquires the signal levels of the first frequency components of the pickup signals from the first level calculating unit 371 and the second level calculating unit 372. In the case of the background noise signal section, the gain setting unit 380 determines the gain values to be set to the first gain calculating unit 361 and the second gain calculating unit 362 on the basis of the signal levels acquired from the first level calculating unit 371 and the second level calculating unit 372 and sets the gain values to the first gain calculating unit 361 and the second gain calculating unit 362.

The process and structure of the second to L-th processing units 312 to 320 are the same as those of the first processing unit 311. The structure of the pickup signal processing apparatus 103 according to the third embodiment other than the above is the same as that of the pickup signal processing apparatus 102 according to the second embodiment.

In the pickup signal processing apparatus 103 according to the third embodiment, the gain setting unit is provided for each frequency. Therefore, it is possible to independently set the gain for each frequency. As a result, when the sensitivity of the microphone is different for each frequency, it is possible to appropriately adjust the gain for each frequency.

Figure 9:
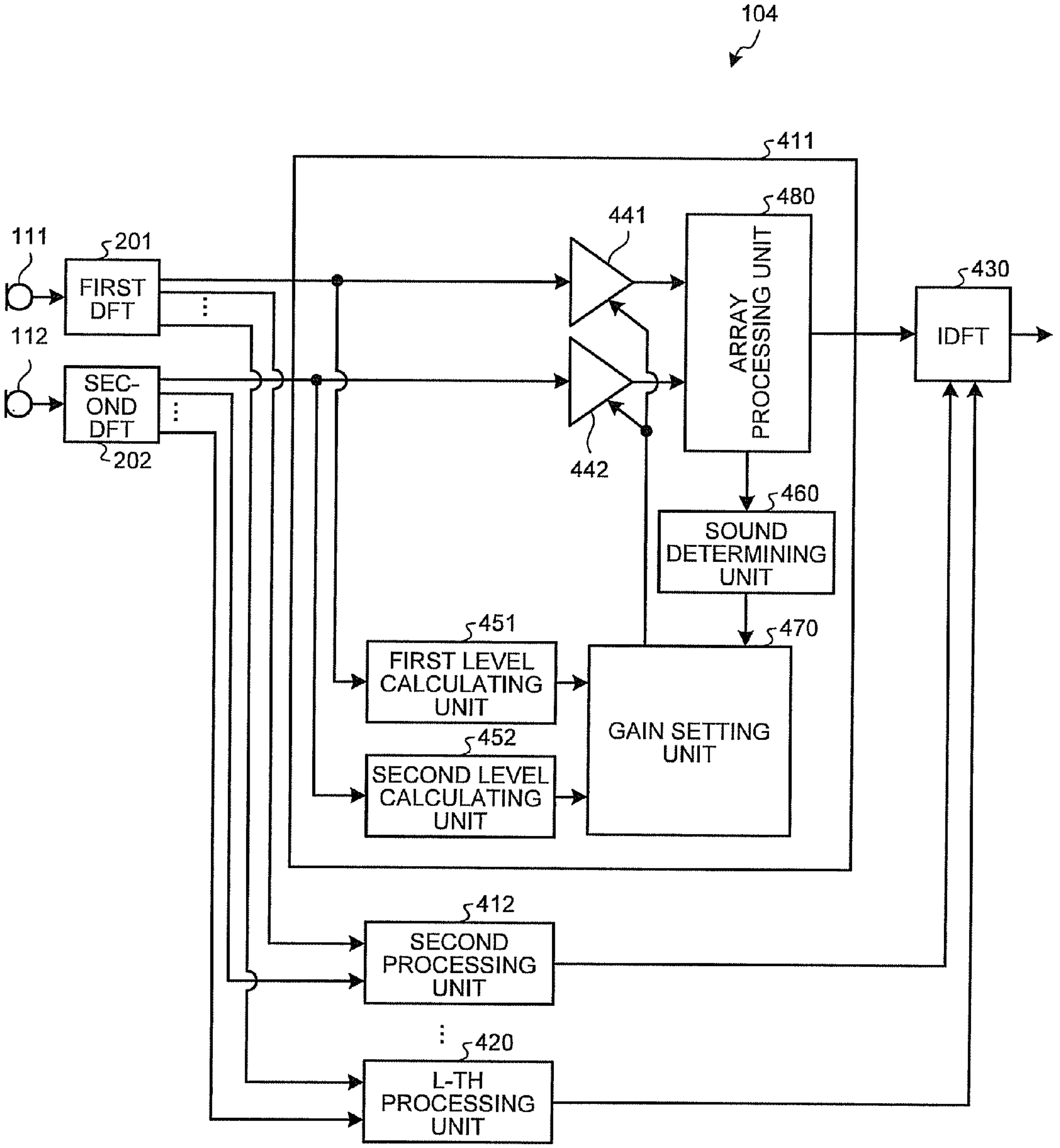
FIG. 9 is block diagram illustrating the structure of a pickup signal processing apparatus.

FIG. 9 is a block diagram illustrating the structure of a pickup signal processing apparatus 104 according to a fourth embodiment. The pickup signal processing apparatus 104 includes a plurality of processing units, that is, first to L-th processing units 411 to 420 that perform gain adjustment for each frequency component, similarly to the pickup signal processing apparatuses according to the second and third embodiments. However, in the pickup signal processing apparatus 104 according to this embodiment, the array processing unit performs a process of estimating the sound source direction and the intensity of the pickup signal, in addition to the processing of an input signal. The sound determining unit determines whether the pickup signal is a voice signal or a background noise signal on the basis of the estimation result of the array processing unit.

The magnitude of the correlation described in other embodiments corresponds to the intensity of the signal in this embodiment. In addition, the phase of coherence or the time difference τ between the correlation values corresponds to the sound source direction.

An array processing unit 480 measures output power in each direction using a beamformer method while scanning the directivity of the array and determines that the sound source is present in the direction in which high output power is given. In the beamformer method, output power in a direction θ is represented by the following Expression (18):

$$Pow(\theta)=a'(\theta)R_{xx}*a(\theta)/a'(\theta)a(\theta) \tag{18}$$

In the above-mentioned expression, a(θ) is a column vector corresponding to the sound source direction and is called, for example, a directional vector or a mode vector. The dimension of a(θ) corresponds to the number of microphones. That is, when the number of microphones is N, a(θ) has N dimensions. a'(θ) is a row vector, which is a transposed vector of a(θ). Rxx is a spatial correlation matrix and indicates the cross-correlation between the channels as a matrix. In the case of two channels, Rxx is represented by the following Expression (19) in the frequency region:

$$R_{xx}(l)=\begin{bmatrix} G_{11}(l) & G_{12}(l) \\ G_{21}(l) & G_{22}(l) \end{bmatrix} \tag{19}$$

In the above-mentioned expression, l is a frequency component number. In Expression (19), a component Gxx is the cross-spectrum described in the third embodiment and indicates the correlation between the channels.

In Expression (18), the directional vector a(θ) does not depend on an input signal. Therefore, the component of Rxx (l) needs to have a large value in order to increase Pow(θ). That is, an increase in the correlation between the pickup signals described in other embodiments is equivalent to the observation of strong directionality in a given direction in array processing.

A sound determining unit 460 compares the maximum value of Pow(θ) calculated by the array processing unit 480 with a predetermined threshold value Pow_th. When Pow(θ) is less than the threshold value, the sound determining unit 460 determines that the correlation is low and the pickup signal is a background noise signal. When Pow(θ) is equal to or more than the threshold value Pow_th, the sound determining unit 460 determines that the correlation is high and the pickup signal is a voice signal.

A gain setting unit 470 determines gain values on the basis of the signal levels acquired from a first level calculating unit 451 and a second level calculating unit 452 in the background noise section in which the pickup signal is determined to be a background noise signal and sets the gain values to a first gain calculating unit 441 and a second gain calculating unit 442.

The process and structure of the second to L-th processing units 412 to 420 are the same as those of the first processing unit 411 described with reference to FIG. 9. The process and structure of the pickup signal processing apparatus 104 other than the above are the same as those of the pickup signal processing apparatuses according to other embodiments.

As a modification of this embodiment, the array processing unit 480 may estimate the sound source direction using other known methods in the related art, such as a MUSIC method using the eigenvalue decomposition of a spatial correlation matrix. A detailed method of estimating the direction is disclosed in M. Brandstein and D. Ward, "Microphone Arrays," Springer, Part II, 2001. Even when a direction search algorithm other than the beamformer method is used, generally, the same result as described above is obtained, that is, strong directionality is observed and a large correlation value is obtained. Just expressions are different.

Figure 10:
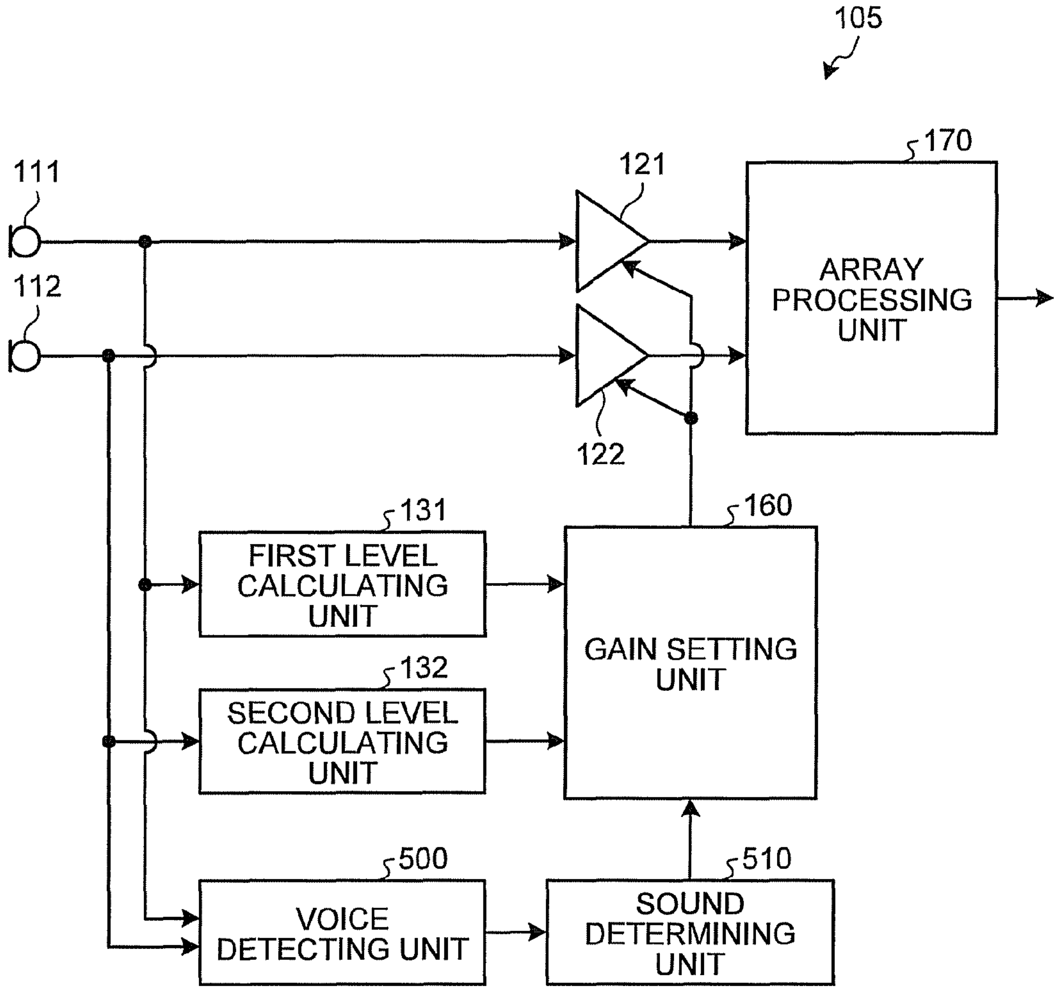
FIG. 10 is a block diagram illustrating the structure of a pickup signal processing apparatus.

FIG. 10 is a block diagram illustrating the structure of a pickup signal processing apparatus 105 according to a fifth embodiment. The pickup signal processing apparatus 105 includes a voice detecting unit 500 instead of the correlation calculating unit 140 of the pickup signal processing apparatus 100 according to the first embodiment. The voice detecting unit 500 is a voice detector, such as a VAD (Voice Activity Detector), and detects whether there is a voice. When there is a voice, a sound determining unit 510 determines that the pickup signal is a voice signal. When there is no voice, the sound determining unit 510 determines that the pickup signal is a noise signal.

For example, when a neighboring sound source that can be considered in a surrounding environment in which the pickup signal processing apparatus 105 is provided is limited to a voice signal, the pickup signal processing apparatus 105 according to this embodiment may determine whether the pickup signal is a voice signal or a background noise signal on the basis of the detection result of the voice detecting unit 500. In this way, it is possible to determine the pickup signal with high accuracy.

The process and structure of the pickup signal processing apparatus 105 other than the above are the same as those of the pickup signal processing apparatus 100 according to the first embodiment.

A method of detecting a voice using the voice detecting unit 500 is not limited to this embodiment. In order to detect a voice, various methods, such as a method of using the power information of a signal, a method of using spectrum information, and a method based on a signal-to-noise ratio, have been proposed. The voice detecting unit 500 may detect a voice using these methods.

Figure 11:
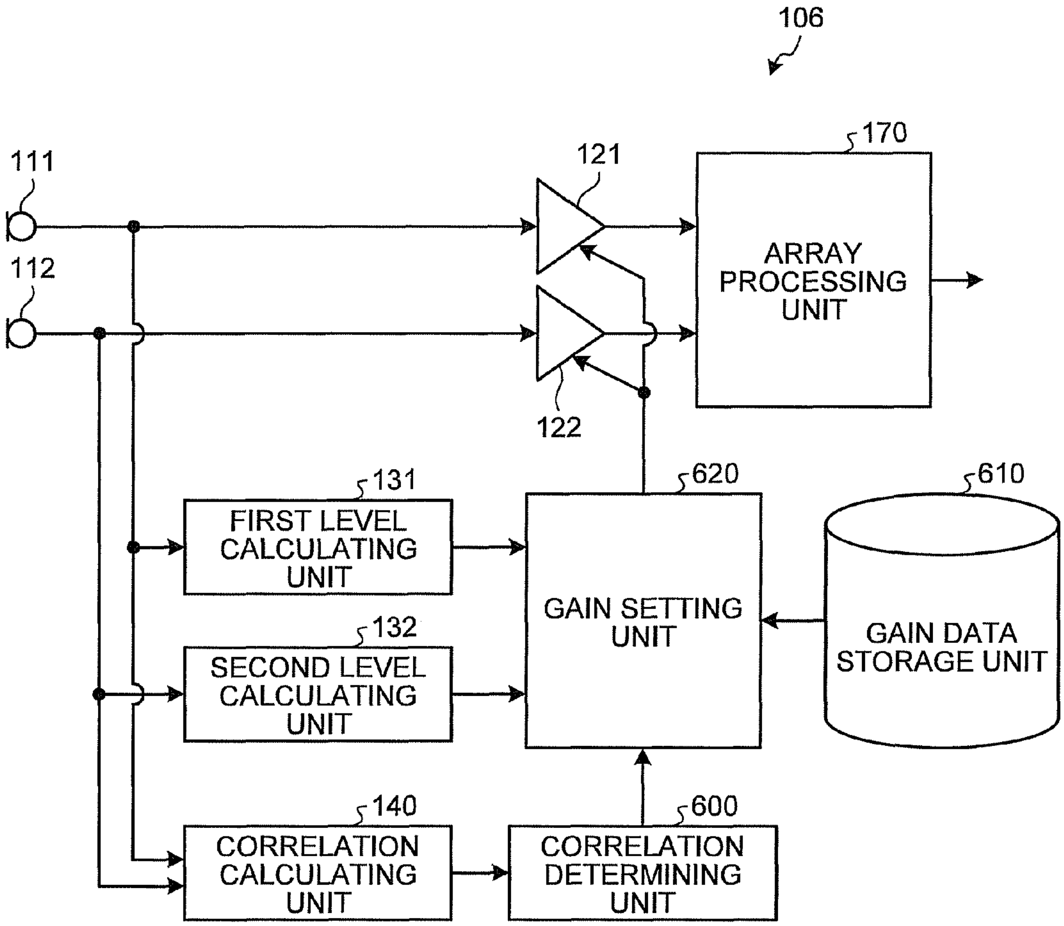
FIG. 11 is a block diagram illustrating the structure of a pickup signal processing apparatus.

FIG. 11 is a block diagram illustrating the structure of a pickup signal processing apparatus 106 according to a sixth embodiment. The pickup signal processing apparatus 106 adjusts a gain value so as to be close to the ideal gain balance of the microphone array in the voice section, not in the background noise section. The pickup signal processing apparatus 106 includes a correlation determining unit 600 instead of the sound determining unit 150 of the pickup signal processing apparatus 100 according to the first embodiment. In addition, the pickup signal processing apparatus 106 includes a gain data storage unit 610 in addition to the structure of the pickup signal processing apparatus 100 according to the first embodiment.

The correlation determining unit 600 acquires a set of the maximum value r12_max of the correlation value and a phase τ12 in this case, that is, τ12_max from the correlation calculating unit 140. The correlation determining unit 600 stores a set of the set values of the correlation value and the phase in this case in advance and compares the set with the acquired set of the maximum value and the phase. The set values are the maximum value r12_max of the correlation value obtained when there is a neighboring sound source and the phase τ12 in this case and are calculated in advance by, for example, experiments. When the values of the r12_max and τ12_max calculated by the correlation calculating unit 140 are equal to the set values of r12_max and τ12_max, an instruction to perform gain adjustment is output to a gain setting unit 620. When the values of the r12_max and τ12_max calculated by the correlation calculating unit 140 are within a given range based on the set values of r12_max and τ12_max, the correlation determining unit 600 determines that the values are matched.

The gain data storage unit 610 stores gain data. The gain data is information indicating an ideal gain balance when a plurality of microphones having matched sensitivities are used to pick up signals in a situation in which the correlation value is the set value stored in the correlation determining unit 600. That is, the gain data indicates the signal power of each microphone in an ideal situation. The gain setting unit 620 determines the gain values to be multiplied by the pickup signals of the first microphone 111 and the second microphone 112 on the basis of the gain data. Specifically, the gain value is multiplied such that the power of the pickup signal multiplied by the gain value is matched to the ideal gain balance. Then, the gain setting unit 620 sets the determined gain values to the first gain calculating unit 121 and the second gain calculating unit 122. In this case, the gain setting unit 620 may set the gain values in stages while setting the ideal gain balance as a target value.

In the pickup signal processing apparatus 106 according to this embodiment, when there is a sound source at a fixed position and the time for which a sound is emitted from the sound source is long, it is possible to effectively adjust the gain.

The process and structure of the pickup signal processing apparatus 106 according to this embodiment are the same as those of the pickup signal processing apparatuses according to other embodiments.

The pickup signal processing apparatus according to the embodiments includes a control device, such as a CPU, a storage device, such as a ROM (Read Only Memory) or a RAM, an external storage device, such as an HDD or a CD driver, a display device, such as a display, and an input device, such as a keyboard or a mouse, and has a hardware structure using a general computer.

A pickup signal processing program executed by the pickup signal processing apparatus according to the embodiments is recorded as a file of an installable format or an executable format on a computer-readable recording medium, such as a CD-ROM, a flexible disk (FD), a CD-R, or a DVD (Digital Versatile Disk), and is then provided.

The pickup signal processing program executed by the pickup signal processing apparatus according to the embodiments may be stored in a computer that is connected thereto through a network, such as the Internet, may be downloaded through the network, and may be provided. In addition, the pickup signal processing program executed by the pickup signal processing apparatus according to the embodiments may be provided or distributed through a network, such as the Internet. Furthermore, the pickup signal processing program according to the embodiments may be incorporated into, for example, a ROM in advance and then provided.

The pickup signal processing program executed by the pickup signal processing apparatus according to the embodiments has a module structure including the above-mentioned units (for example, the first gain calculating unit, the second gain calculating unit, the first level calculating unit, the second level calculating unit, the correlation calculating unit, the sound determining unit, the gain setting unit, and the array processing unit). As the actual hardware, a CPU (processor) reads the pickup signal processing program from the above-mentioned storage medium and executes the pickup signal processing program. Then, the above-mentioned units are loaded to a main storage device and are then generated on the main storage device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pickup signal processing apparatus comprising:

a plurality of microphones that pick up sounds containing a voice and obtain pickup signals;

a sound determining unit that determines whether the pickup signals are signals from a neighboring sound source which is close to the microphones or background noise signals;

a signal level calculating unit that calculates signal levels for the microphones using the pickup signals;

a setting unit that sets a gain value of at least one microphone on the basis of the signal levels for the microphones, when the sound determining unit determines that the pickup signals are the background noise signals, and that prohibits setting the gain value of the at least one microphone when the sound determining unit determines that the pickup signals are the signals from the neighboring sound source, the gain value being set so as to reduce a difference between the signal levels for the microphones; and a calculating unit that multiplies a pickup signal of the at least one microphone by the gain value set by the setting unit.

2. The apparatus according to claim 1, wherein the setting unit sets an adjustment width of the gain value when the currently set gain value is changed to a target gain value that allows the signal levels of the plurality of microphones to be equal to each other, and whenever a first predetermined time has elapsed, the setting unit sets a value obtained by changing the set gain value by the adjustment width as a first new gain value.

3. The apparatus according to claim 1, further comprising:

a correlation calculating unit that calculates a correlation between the pickup signals picked up by the plurality of microphones, wherein, when the correlation calculated by the correlation calculating unit is less than a predetermined threshold value, the sound determining unit determines that the pickup signal is the background noise signals.

4. The apparatus according to claim 3, further comprising:

a conversion unit that converts the pickup signals into frequency components, wherein the signal level calculating unit calculates the signal level of each pickup signal for each of the frequency components obtained by the conversion unit, the correlation calculating unit calculates a correlation between the frequency components, the setting unit sets the gain value for each of the frequency components and sets the gain value of the pickup signal for each frequency component, and the calculating unit multiplies each frequency component of the pickup signal by the gain value that is set for each frequency component.

5. The apparatus according to claim 2, wherein, whenever a second predetermined time has elapsed, the sound determining unit determines whether the pickup signals are the signals from the neighboring sound source or the background noise signals, and when it is continuously determined that the pickup signals are the background noise signals for a third predetermined time, the determining unit determines a second new gain value of the pickup signal.

6. The apparatus according to claim 1, further comprising:

a voice detecting unit that detects a voice from the pickup signals, wherein, when no voice is detected by the voice detecting unit, the sound determining unit determines that the pickup signals are the background noise signals.

7. A pickup signal processing apparatus comprising:

a plurality of microphones that are provided at predetermined positions and pick up sounds containing a voice and obtain pickup signals;

a sound determining unit that determines whether the pickup signals are signals from a neighboring sound source which is close to the microphones or noise signals which do not include the signals from the neighboring sound source;

a signal level calculating unit that calculates signal levels for the microphones using the pickup signals;

a setting unit that sets a gain value of at least one microphone on the basis of the signal levels for the microphones, when the sound determining unit determines that the pickup signals are the signals from the neighboring sound source, and that prohibits setting the gain value of the at least one microphone when the sound determining unit determines that the pickup signals are the noise signals, the gain value being set so as to allow a balance between the signal levels for the microphones to be close to an ideal balance between the signal levels for the microphones provided at the predetermined positions, the ideal balance being stored in a storage unit in advance; and a calculating unit that multiplies a pickup signal of the at least one microphone by the gain value set by the setting unit.

8. A pickup signal processing program product having a non-transitory computer readable medium including programmed instructions, wherein the instructions, when executed by a computer, causes the computer to perform:

acquiring pickup signals from a plurality of microphones;

determining whether the pickup signals are signals from a neighboring sound source which is close to the microphones or background noise signals;

calculating signal levels for the microphones using the pickup signals;

setting a gain value of at least one microphone on the basis of the signal levels for the microphones, when determined that the pickup signals are the background noise signals, and prohibiting setting of the gain value of the at least one microphone when determined that the pickup signals are the signals from the neighboring sound source, the gain value being set so as to reduce a difference between the signal levels for the microphones; and multiplying a pickup signal of the at least one microphone by the set gain value.

9. A pickup signal processing program product having a non-transitory computer readable medium including programmed instructions, wherein the instructions, when executed by a computer, causes the computer to perform:

acquiring pickup signals from a plurality of microphones provided at predetermined positions;

determining whether the pickup signals are signals from a neighboring sound source which is close to the microphones or noise signals which do not include the signals from the neighboring sound source;

calculating signal levels for the microphones using the pickup signals;

setting a gain value of at least one microphone on the basis of the signal levels for the microphones, when determined that the pickup signals are the signals from the neighboring sound source, and prohibiting setting of the gain value of the at least one microphone when determined that the pickup signals are the noise signals, the gain value being set so as to allow a balance between the signal levels for the microphones to be close to an ideal balance between the signal levels for the microphones provided at the predetermined positions, the ideal balance being stored in a storage unit in advance; and multiplying a pickup signal of the at least one microphone by the set gain value.

10. A pickup signal processing method comprising:

acquiring pickup signals from a plurality of microphones;

determining whether the pickup signals are signals from a neighboring sound source which is close to the microphones or background noise signals;

calculating signal levels for the microphones using the pickup signals;

setting a gain value of at least one microphone on the basis of the signal levels for the microphones, when determined that the pickup signals are the background noise signals, and prohibiting setting of the gain value of the at least one microphone when determined that the pickup signals are the signals from the neighboring sound source, the gain value being set so as to reduce a difference between the signal levels for the microphones; and multiplying a pickup signal of the at least one microphone by the set gain value.

11. A pickup signal processing method comprising:

acquiring pickup signals from a plurality of microphones provided at predetermined positions;

determining whether the pickup signals are signals from a neighboring sound source which is close to the microphones or a noise signal which does not include the signal from the neighboring sound source;

calculating signal levels of for the microphones using the pickup signals;

setting a gain value of at least one microphone on the basis of the signal levels for the microphones, when determined that the pickup signals are the signal from the neighboring sound source, and prohibiting setting of the gain value of the at least one microphone when determined that the pickup signals are the noise signals, the gain value being set so as allow a balance between the signal levels for the microphones to be close to an ideal balance between the signal levels for the microphones provided at the predetermined positions, the ideal balance being stored in a storage unit in advance; and multiplying a pickup signal of the at least one microphone by the gain value.

* * * * *